United States Patent
Hirano et al.

(10) Patent No.: US 6,570,099 B1
(45) Date of Patent: May 27, 2003

(54) THERMAL CONDUCTIVE SUBSTRATE AND THE METHOD FOR MANUFACTURING THE SAME

(75) Inventors: Koichi Hirano, Osaka (JP); Seiichi Nakatani, Osaka (JP); Mitsuhiro Matsuo, Osaka (JP); Hiroyuki Handa, Osaka (JP); Yoshihisa Yamashita, Kyoto (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/694,445

(22) Filed: Oct. 23, 2000

(30) Foreign Application Priority Data

Nov. 9, 1999 (JP) ............................ 11-317747

(51) Int. Cl.⁷ .................................................. H05K 1/00
(52) U.S. Cl. ........................................ 174/258; 361/813
(58) Field of Search ................................ 174/254–259; 361/813

(56) References Cited

U.S. PATENT DOCUMENTS 5,546,655 A * 8/1996 Feger et al. .................. 29/846
5,812,381 A * 9/1998 Shigeta et al. ............... 361/813
6,060,150 A   5/2000 Nakatani et al.

FOREIGN PATENT DOCUMENTS

| JP | 7-86704 | 3/1995 |
| JP | 10-173097 | 6/1998 |
| JP | 10-242607 | 9/1998 |

* cited by examiner

Primary Examiner—David L. Talbott
Assistant Examiner—Jeremy Norris
(74) Attorney, Agent, or Firm—Merchant & Gould P.C.

(57) ABSTRACT

A thermal conductive substrate includes a first electrical insulator layer, a second electrical insulator layer and a lead frame serving as a circuit pattern. The first electrical insulator layer is formed of a thermal conductive resin composition containing a thermosetting resin and an inorganic filler, and is joined to the lead frame. The second electrical insulator layer is provided on the side of the first electrical insulator layer not in contact with the lead frame, and is formed of a thermal conductive resin composition containing the inorganic filler and a resin composition containing the thermosetting resin. The second electrical insulator layer has a higher thermal conductivity than the first electrical insulator layer. Thus, it is possible to achieve higher heat-radiating characteristics and component packaging reliability without deteriorating formability and adhesive characteristics of the electrical insulator layers.

20 Claims, 6 Drawing Sheets

FIG. 4A  FIG. 4B
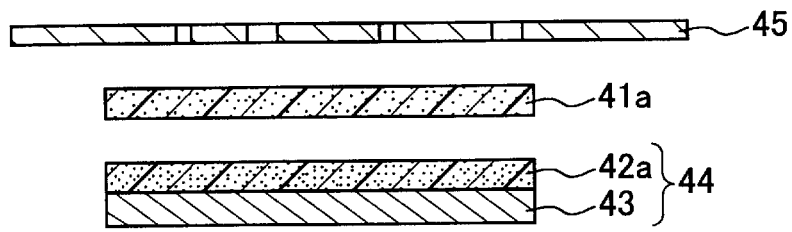
FIG. 4C
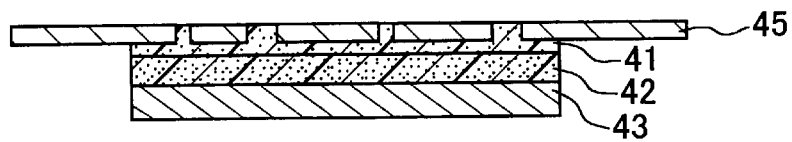
FIG. 4D

THERMAL CONDUCTIVE SUBSTRATE AND THE METHOD FOR MANUFACTURING THE SAME

FIELD OF THE INVENTION

The present invention relates to a circuit board on which various types of semiconductor devices and electronic components are mounted. In particular, the present invention relates to a thermal conductive substrate that is constituted by a resin substrate with high heat-radiating characteristics suitable for a power electronics field, and to a method for manufacturing the same.

BACKGROUND OF THE INVENTION

Accompanying the request for high performance and miniaturization of electronic equipment in recent years, there has been a demand for high-density packaging of electronic components and semiconductors. Accordingly, it is more likely that heat generated from different components is concentrated, leading to a higher temperature. In order to release this heat from the equipment quickly, it is important to design the equipment considering heat radiation. Thus, circuit boards also need to have high heat-radiating characteristics.

In order to improve the heat-radiating characteristics of the circuit boards, there are conventional printed boards using glass-epoxy resin. On the other hand, metal-based circuit boards also have been suggested. The metal-based circuit board is produced in such a manner that circuit patterns are formed on one side or both sides of a metal plate such as copper or aluminum via an insulator layer. When still higher heat-radiating characteristics are required, a substrate that is formed by directly joining a copper plate to a ceramic substrate such as alumina or aluminum nitride is used. Generally, the metal-based circuit boards are used for applications requiring relatively small electric power. However, the insulator layer has to be thin to achieve high thermal conductivity. This causes problems in that the metal-base circuit boards are susceptible to noise between the insulator layer and the metal base and have low withstand voltage.

For the purpose of solving these problems, a substrate formed in the following manner has been suggested recently. That is, a composition produced by filling an inorganic filler having an excellent thermal conductivity in a thermosetting resin is integrated with a lead frame serving as an electrode, so as to obtain the substrate. The substrate using such composition is disclosed, for example, in JP 10 (1998)-173097 A. FIG. 6 shows the method for manufacturing this thermal conductive substrate. First, a thermal conductive resin composition slurry containing at least the inorganic filler and the thermosetting resin is formed so as to obtain a thermal conductive green sheet 61. This thermal conductive green sheet 61 is dried, then stacked onto a lead frame 62 as shown in FIG. 6A. Subsequently, as shown in FIG. 6B, the thermal conductive green sheet 61 is cured by heating and pressing so as to be an insulator layer 63 containing a thermal conductive resin cured material. In this manner, a thermal conductive substrate 64 is completed.

When producing the substrate by such a method, in order to maintain high heat-radiating characteristics and withstand voltage of the thermal conductive substrate 64 and to increase the adhesive strength of the lead frame 62 serving as a wiring pattern to the insulator layer 63, it is preferable that the thermal conductive resin composition constituting the thermal conductive green sheet 61 covers the end faces of the wiring pattern of the lead frame 62. Thus, at the time of heating and pressing, the thermal conductive resin composition has to have the fluidity necessary for covering the end faces of the pattern of the lead frame 62. On the other hand, in order to increase the thermal conductivity of the thermal conductive substrate, the higher ratio of the inorganic filler in the thermal conductive resin composition is effective. However, when the ratio of the inorganic filler increases, the fluidity of the thermal conductive resin composition decreases. This causes a problem in that it becomes difficult to cover the end faces of the lead frame with the thermal conductive resin composition. In addition, when the ratio of the inorganic filler increases, the organic constituent for maintaining adhesive characteristics between the thermal conductive resin compositions decreases. This causes a problem in that it becomes difficult to process the thermal conductive resin composition into a desired shape and to maintain and handle this shape.

SUMMARY OF THE INVENTION

It is an object of the present invention to solve the problems described above and to increase thermal conductivity of a substrate and, at the same time, maintain fluidity of a thermal conductive resin composition so as to cover the end faces of a lead frame with the thermal conductive resin composition in a portion where the lead frame is in contact with the thermal conductive resin composition, thereby maintaining high heat-radiating characteristics and reliability. It is a further object of the present invention to achieve easy handling of the thermal conductive resin composition, thereby making it easier to produce the substrate.

The above-described object can be achieved in the following manner.

First, a thermal conductive substrate of the present invention includes a first electrical insulator layer, a second electrical insulator layer, and a lead frame serving as a circuit pattern. The first electrical insulator layer is formed of a thermal conductive resin composition containing a thermosetting resin and an inorganic filler (hereinafter, also referred to as a reinforcing material), and is joined to the lead frame. The second electrical insulator layer is provided on a side of the first electrical insulator layer not in contact with the lead frame, and is formed of a thermal conductive resin composition containing the inorganic filler and a resin composition containing the thermosetting resin. The second electrical insulator layer has a higher thermal conductivity than the first electrical insulator layer.

Next, a first method for manufacturing the thermal conductive substrate of the present invention includes producing a first thermal conductive resin composition by mixing an inorganic filler and a resin composition containing a thermosetting resin that is not cured, producing a second thermal conductive resin composition having a higher thermal conductivity than the first thermal conductive resin composition by mixing the inorganic filler and the resin composition containing the thermosetting resin that is not cured, and stacking a lead frame, the first thermal conductive resin composition and the second thermal conductive resin composition in this order and integrating them by heating and pressing, as well as curing the thermosetting resin.

Then, a second method for manufacturing the thermal conductive substrate of the present invention includes processing a first thermal conductive resin composition that has been produced by mixing an inorganic filler and a resin composition containing a thermosetting resin that is not cured into a sheet, producing a second thermal conductive resin composition having a higher thermal conductivity than the first thermal conductive resin composition by mixing the inorganic filler and the resin composition containing the thermosetting resin that is not cured, processing the second thermal conductive resin composition into a layer having a substantially constant thickness and adhering the layer onto a heat-radiating board, and stacking a lead frame, the first thermal conductive resin composition and the heat-radiating board provided with the second thermal conductive resin composition in this order so that the first and second thermal conductive resin compositions contact each other and integrating them by heating and pressing, as well as curing the thermosetting resin.

Next, a third method for manufacturing the thermal conductive substrate of the present invention includes processing a second thermal conductive resin composition produced by mixing an inorganic filler and a resin composition containing a thermosetting resin that is not cured into a layer having a substantially constant thickness and adhering the layer onto a heat-radiating board, processing a first thermal conductive resin composition produced by mixing the inorganic filler and the resin composition containing the thermosetting resin that is not cured and having a lower thermal conductivity than the second thermal conductive resin composition into a layer having a substantially constant thickness, and adhering the layer onto the second thermal conductive resin composition that has been adhered onto the heat-radiating board in the first step, and stacking a lead frame and the heat-radiating board provided with the first and second thermal conductive resin compositions so that the lead frame and the first thermal conductive resin composition contact each other and integrating them by heating and pressing, as well as curing the thermosetting resin.

In the present invention, the lead frame is formed by arranging a wiring pattern on a metal plate. Leads (terminals) are connected to each other by a frame so as to be formed into one component. After the formation, the frame portion is cut off, so that the terminals are insulated electrically. The heat-radiating board is a plate provided to the substrate for the purpose of promoting a radiation of heat generated in elements on the substrate out of an appliance and dissipating the heat quickly to a large area, thereby preventing a local temperature increase. In many cases, the heat-radiating board is made of metal and also serves as a structural reinforcement and a ground connection. In addition, the inorganic filler in the present invention is a powder made of an inorganic substance and has an effect of providing a function (heat-radiating characteristics) when filled into a resin matrix.

BRIEF DESCRIPTION OF THE DRAWINGS

FIGS. 4A to 4D are sectional views illustrating the steps for manufacturing a thermal conductive substrate in accordance with a third embodiment of the present invention.

DETAILED DESCRIPTION OF THE INVENTION

Figure 1:
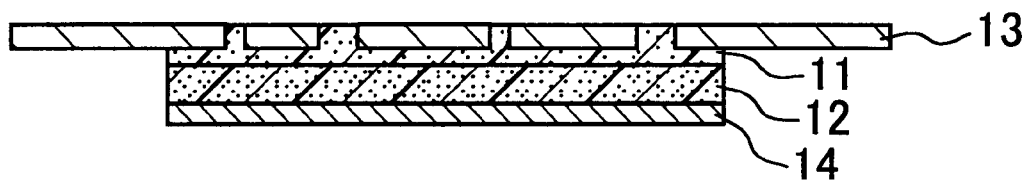
FIG. 1 is a sectional view illustrating a thermal conductive substrate in accordance with a first embodiment of the present invention.

In accordance with a thermal conductive substrate of the present invention, a first electrical insulator layer (also referred to as a first insulator layer) can maintain excellent adhesive characteristics to a lead frame, at the same time a second electrical insulator layer (also referred to as a second insulator layer) can achieve higher thermal conductivity than the first electrical insulator layer, thereby combining high reliability and heat dissipation characteristics.

It is preferable that the second electrical insulator layer has a higher blend ratio of the inorganic filler than the first electrical insulator layer. In order to improve the heat conductivity of the thermal conductive resin composition, the higher ratio of the inorganic filler is effective. Thus, it becomes easier to combine high reliability and heat dissipation characteristics.

Also, it is preferable that the first electrical insulator layer has a ratio of the inorganic filler of 70 to 95 wt %. It is preferable that the second electrical insulator layer has a ratio of the inorganic filler of 72 to 97 wt %.

Furthermore, it is preferable that the second electrical insulator layer is thicker than the first electrical insulator layer. This is because an excessively thick first electrical insulator layer is unlikely to produce the effect of improving the heat dissipation characteristics of the second electrical insulator layer. Especially, it is preferable that a total thickness of the first and second electrical insulator layers is at least 0.4 mm, and the first electrical insulator layer has a thickness of not larger than 0.1 mm.

Also, a structure in which the second electrical insulator layer includes the resin composition containing the thermosetting resin, the inorganic filler and a reinforcing material may be possible. This is because the reinforcing material improves the strength of the substrate so that it becomes easier to manufacture the substrate. It is preferable that the reinforcing material is formed of a ceramic fiber or a glass fiber. This is because these materials have a high thermal stability and a high thermal conductivity to resins. Furthermore, it is preferable that the reinforcing material is a non-woven fabric or a woven fabric. In particular, the non-woven fabric is preferable, because it has low fiber density as the reinforcing material and takes in the inorganic filler easily. Preferably, the fiber diameter is not larger than 20 $\mu$m, and more preferably, it ranges approximately from 3 to 10 $\mu$m.

It is preferable that the first electrical insulator layer has a thermal conductivity of at least 1 W/m·K (Watt/Meters·Kelvin) and not higher than 5 W/m·K, and the second electrical insulator layer has a thermal conductivity of higher than 5 W/m·K and not higher than 15 W/m·K. With this example, the first electrical insulator layer can maintain an excellent adhesive characteristics to the lead frame, and at the same time, the second electrical insulator layer can achieve higher thermal conductivity than the first electrical insulator layer, thereby combining high reliability and heat dissipation characteristics.

In the thermal conductive substrate of the present invention, an end face of the circuit pattern of the lead frame is covered with the insulator layer in a portion where the circuit pattern is in contact with the insulator layer. This increases an adhesive strength of the lead frame to the insulator layer, thereby obtaining reliability of the substrate. Furthermore, in the thermal conductive substrate of the present invention, it is preferable that the lead frame is embedded in the insulator layer so as to be flush with a surface of the insulator layer. This is advantageous for the following reason. Since not only the adhesive strength of the lead frame increases, but also after-treatments such as a solder resist processing become easier, it becomes easier to arrange components between patterns and connect them by soldering.

Moreover, in the thermal conductive substrate of the present invention, it is preferable that a heat-radiating board is joined on an outer side of the second electrical insulator layer. This is because heat dissipation becomes easier when the substrate is mounted on the equipment.

In the present invention, a third electrical insulator layer optionally may be formed between the first and second electrical insulator layers or on an outer side of the second electrical insulator layer.

Next, a first method for manufacturing the thermal conductive substrate of the present invention includes a first process of producing a first thermal conductive resin composition by mixing an inorganic filler and a resin composition containing a thermosetting resin that is not cured, a second process of producing a second thermal conductive resin composition having a higher thermal conductivity than the first thermal conductive resin composition in a manner similar to the first process, and a third process of stacking a lead frame, the first thermal conductive resin composition and the second thermal conductive resin composition in this order and integrating them by heating and pressing, as well as curing the thermosetting resin.

In the second process mentioned above, the second thermal conductive resin composition that has a higher thermal conductivity and a higher ratio of the inorganic filler than the first thermal conductive resin composition may be manufactured.

In the manufacturing method mentioned above, it is preferable that a process in which each of the first and second thermal conductive resin compositions is processed into a sheet respectively is added after the first and second processes. This process makes it easier to integrate them by heating and pressing.

Also, in the second process mentioned above, it is preferable that a reinforcing material is impregnated with a mixture of the inorganic filler and the resin composition containing the thermosetting resin that is not cured so as to produce the second thermal conductive resin composition.

Furthermore, in the third process mentioned above, in addition to the lead frame, the first thermal conductive resin composition and the second thermal conductive resin composition that have been stacked, a heat-radiating board further may be stacked on the side of the second thermal conductive resin composition, and integrated by heating and pressing, as well as curing the thermosetting resin. This makes it possible to provide the heat-radiating board achieving easier heat dissipation from the substrate in a simple manner.

Also, a second method for manufacturing the thermal conductive substrate of the present invention includes a first process of processing a first thermal conductive resin composition that has been produced by mixing an inorganic filler and a resin composition containing a thermosetting resin that is not cured into a sheet, a second process of producing a second thermal conductive resin composition having a higher thermal conductivity than the first thermal conductive resin composition in a manner similar to the first process and processing the second thermal conductive resin composition into a layer having a substantially constant thickness and adhering the layer onto a heat-radiating board, and a third process of stacking a lead frame, the first thermal conductive resin composition and the heat-radiating board provided with the second thermal conductive resin composition in this order so that the first and second thermal conductive resin compositions contact each other and integrating them by heating and pressing, as well as curing the thermosetting resin. According to this method, it is possible to produce the thermal conductive substrate even when the second thermal conductive resin composition is difficult to be formed into a sheet.

Moreover, a third method for manufacturing the thermal conductive substrate of the present invention includes a first process of processing a second thermal conductive resin composition produced by mixing an inorganic filler and a resin composition containing a thermosetting resin that is not cured into a layer having a substantially constant thickness and adhering the layer onto a heat-radiating board, a second process of processing a first thermal conductive resin composition produced in a manner similar to the first process and having a lower thermal conductivity than the second thermal conductive resin composition into a layer having a substantially constant thickness, and adhering the layer onto the second thermal conductive resin composition that has been adhered onto the heat-radiating board in the first process, and a third process of stacking a lead frame and the heat-radiating board provided with the first and second thermal conductive resin compositions so that the lead frame and the first thermal conductive resin composition contact each other and integrating them by heating and pressing, as well as curing the thermosetting resin. With this method, it becomes unnecessary to process compositions into a sheet, achieving still easier production of the substrate.

In these manufacturing methods, it is preferable that the second thermal conductive resin composition is made thicker than the first thermal conductive resin composition. Furthermore, it is preferable that insulator layers formed of the first and second thermal conductive resin compositions are processed to be at least 0.4 mm thick in total, and the insulator layer formed of the second thermal conductive resin composition is processed to have a thickness smaller than the total thickness of the insulator layers and not smaller than a thickness 0.1 mm smaller than the total thickness of the insulator layers.

Also, in any of the manufacturing methods described above, it is preferable that the first thermal conductive resin composition has a ratio of the inorganic filler of 70 to 95 wt %.

In the manufacturing method including the process of processing the second thermal conductive resin composition into the layer having the substantially constant thickness and adhering the layer onto the heat-radiating board, the above process can be carried out by heating and pressing the second thermal conductive resin composition that is in powder or paste-like form and adhering it to the heat-radiating board.

Furthermore, in this case, it may be possible that the second thermal conductive resin composition is heated and pressed so as to be adhered to the heat-radiating board, and at the same time, the thermosetting resin in the second thermal conductive resin composition is cured, thus producing a heat-radiating board provided with a second insulator layer. This makes it easier to preserve the heat-radiating board provided with the second insulator layer.

In the method for manufacturing the thermal conductive substrate in accordance with embodiments of the present invention, a basic element is the thermal conductive resin composition containing the inorganic filler and the thermosetting resin that is not cured. Since the thermal conductive resin composition has a high degree of freedom in its shape, it is easy to be processed into a sheet or a layer or to impregnate the reinforcing material with it. In addition, since the resin contained in the thermal conductive resin composition is not cured, it is possible to adhere the thermal conductive resin composition to the lead frame serving as the wiring pattern or to the heat-radiating board by heating and pressing, thereby achieving high insulation characteristics, airtightness and adhesive characteristics. Furthermore, since it is possible to mix the inorganic filler in a high ratio, high thermal conductivity can be achieved and the coefficient of thermal expansion of the substrate can be lowered. In this manner, the use of the thermal conductive resin composition makes it possible to combine the high electrical insulation characteristics and thermal conductivity and reliability, thus obtaining the thermal conductive substrate with excellent heat-radiating characteristics by a simple method.

A method for manufacturing the thermal conductive substrate in accordance with a first embodiment of the present invention includes processing a first thermal conductive resin composition containing an inorganic filler and a thermosetting resin that is not cured into a sheet, further processing a second thermal conductive resin composition having a higher thermal conductivity than the first thermal conductive resin composition into a sheet in a manner similar to the first thermal conductive resin composition, then stacking a lead frame, the first sheet-like member and the second sheet-like member in this order and integrating them by heating and pressing, as well as curing the thermosetting resin.

A method for manufacturing the thermal conductive substrate in accordance with a second embodiment of the present invention includes processing a first thermal conductive resin composition containing an inorganic filler and a thermosetting resin that is not cured into a sheet, further processing a sheet-like second thermal conductive resin composition having a higher thermal conductivity than the first thermal conductive resin composition by impregnating a reinforcing material with a mixture containing the inorganic filler and the thermosetting resin that is not cured, then stacking a lead frame, the first sheet-like member and the second sheet-like member in this order and integrating them by heating and pressing, as well as curing the thermosetting resin.

A method for manufacturing the thermal conductive substrate in accordance with a third embodiment of the present invention includes processing a first thermal conductive resin composition containing an inorganic filler and a thermosetting resin that is not cured into a sheet, further processing a second thermal conductive resin composition having a higher thermal conductivity than the first thermal conductive resin composition into a layer having a substantially constant thickness and adhering the layer onto the heat-radiating board, then stacking a lead frame, the first sheet-like member and the heat-radiating board provided with the second thermal conductive resin composition in this order so that the first and second thermal conductive resin compositions contact each other and integrating them by heating and pressing, as well as curing the thermosetting resin.

A method for manufacturing the thermal conductive substrate in accordance with a fourth embodiment of the present invention includes processing a second thermal conductive resin composition containing an inorganic filler and a resin composition containing a thermosetting resin that is not cured into a layer having a substantially constant thickness and adhering the layer onto a heat-radiating board, further processing a first thermal conductive resin composition having a lower thermal conductivity than the second thermal conductive resin composition into a layer having a substantially constant thickness and adhering the layer onto the second thermal conductive resin composition, then stacking a lead frame and the heat-radiating board provided with the first and the second thermal conductive resin compositions so that the thermal conductive resin composition and the lead frame contact each other and integrating them by heating and pressing, as well as curing the thermosetting resin.

The following is a specific description of the thermal conductive substrate according to embodiments of the present invention and the method for manufacturing the same, with reference to the accompanying drawings.

First Embodiment

FIG. 1 is a sectional view illustrating the structure of a thermal conductive substrate in accordance with the first embodiment of the present invention. In FIG. 1, numeral 11 denotes a first electrical insulator layer, and numeral 12 denotes a second electrical insulator layer. Numeral 13 denotes a lead frame serving as a wiring pattern, and numeral 14 denotes a heat-radiating board.

The first electrical insulator layer 11 and the second electrical insulator layer 12 are formed of a thermal conductive resin composition containing an inorganic filler and a resin composition containing a thermosetting resin. The second electrical insulator layer 12 is prepared so as to have a higher thermal conductivity than the first electrical insulator layer 11. The second electrical insulator layer 12 has higher blend ratio of the inorganic filler than the first electrical insulator layer.

The inorganic filler may be selected suitably from the ones with excellent insulation characteristics and thermal conductivity. It is especially preferable that the inorganic filler contains at least one powder selected from the group consisting of $Al_2O_3$, MgO, BN, $Si_3N_4$, AlN, $SiO_2$ and SiC as a main component. These powders have an excellent thermal conductivity so that the substrate with high heat dissipation characteristics can be produced. Especially when $Al_2O_3$ or $SiO_2$ is used, it is easy to be mixed with the resin composition. When AlN is used, the heat dissipation characteristics of the thermal conductive substrate are improved particularly. Preferably, the mean particle size of the inorganic filler ranges from 0.1 to 100 $\mu$m, and more preferably, it ranges from 0.1 to 50 $\mu$m. When the particle size does not fall into this range, the filling characteristics of the filler and the heat-radiating characteristics of the substrate tend to decline.

It is preferable that the first electrical insulator layer 11 has the ratio of the inorganic filler of 70 to 95 wt %. When the blend ratio of the inorganic filler lies below this range, the heat-radiating characteristics of the substrate tend to be inadequate. On the other hand, when it lies above this range, the fluidity of the thermal conductive resin composition tends to decrease so that it becomes difficult to integrate the thermal conductive resin composition with the lead frame 13. It is preferable that the second electrical insulator layer has the ratio of the inorganic filler of 72 to 97 wt %. In addition, it is preferable that the thermal conductivity of the first electrical insulator layer is at least 1 W/m·K and not higher than 5 W/m·K, and that the thermal conductivity of the second electrical insulator layer is higher than 5 W/m·K and not higher than 15 W/m·K.

The main component of the thermosetting resin in the thermal conductive resin composition can be, for example, epoxy resin, phenolic resin, resin containing isocyanate, acrylic-melamine resin, unsaturated polyester resin, diallylphthalate resin or silicone resin, and it is preferable that at least one selected from the group consisting of these resins is used. In particular, it is preferable that at least one resin selected from the group consisting of epoxy resin, phenolic resin and resin containing isocyanate is used. This is because these resins have excellent thermal stability, mechanical strength and electrical insulation characteristics. In addition, the thermosetting resins in the first and second thermal conductive resin compositions that form the first electrical insulator layer 11 and the second electrical insulator layer 12 may be different, as long as they can maintain the integration even after they are cured.

The thermal conductive resin composition can be manufactured by weighing and mixing the materials. For example, a ball mill, a planetary mixer or a stirrer can be used for the mixing.

Metal with high electric conductivity is used as the lead frame 13. For example, copper, iron, nickel, aluminum or alloy mainly containing these metals can be used. They are preferable because of their small resistance. The method for forming patterns of the lead frame 13 is not limited specifically, and can be, for example, etching or punching. In addition, it is preferable that the surface of the lead frame 13 is plated with at least one metal selected from the group consisting of nickel, tin, solder, gold and palladium and alloys thereof. The reason is that plating improves corrosion resistance and oxidation resistance of the lead frame 13, and that adhesion to the thermal conductive resin composition is improved, thereby increasing reliability of the thermal conductive substrate.

Furthermore, it is preferable that the surface of the lead frame 13 to be adhered to the thermal conductive resin composition is roughened, because this improves adhesive strength, thus improving reliability. The method for the roughening is not limited specifically, and can be sand blasting, etching or the like. In particular, the sand blasting is preferable because it is easy to roughen the surface so that a large surface roughness of the lead frame 13 can be obtained, thereby further improving the adhesive strength.

As the heat-radiating board 14, materials can be selected according to their thermal conductivity and coefficient of thermal expansion. For example, metal or alloy plate containing aluminum, copper and AlSiC can be used. The thermal conductive substrate provided with the heat-radiating board 14 has been discussed in FIG. 1, but the thermal conductive substrate does not have to be provided with the heat-radiating board 14.

Figure 2A:
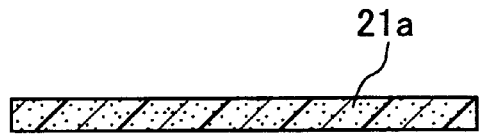
FIGS. 2A to 2D are sectional views illustrating the steps for manufacturing the thermal conductive substrate in accordance with the first embodiment of the present invention.
Figure 2B:
Figure 2C:
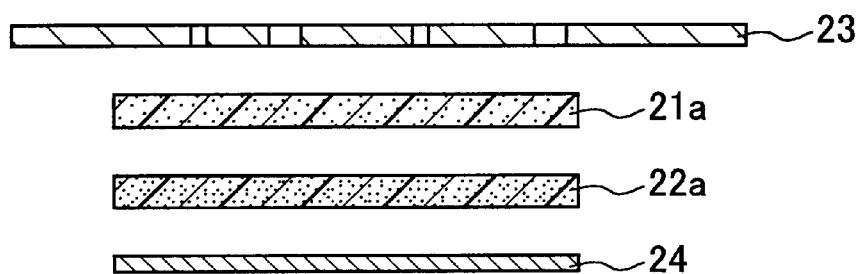
Figure 2D:
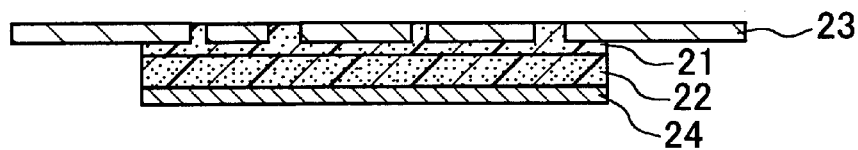

FIGS. 2A to 2D are sectional views illustrating the steps for manufacturing the thermal conductive substrate in accordance with the first embodiment. In FIG. 2A, numeral 21a indicates a first sheet-like thermal conductive resin composition formed by processing the first thermal conductive resin composition into a sheet. In FIG. 2B, numeral 22a indicates a second sheet-like thermal conductive resin composition formed by processing the second thermal conductive resin composition having higher thermal conductivity than the first thermal conductive resin composition into a sheet. As shown in FIG. 2C, a lead frame 23, the first sheet-like thermal conductive resin composition 21a, the second sheet-like thermal conductive resin composition 22a and a heat-radiating board 24 are stacked. When this is heated and pressed, the first sheet-like thermal conductive resin composition 21a is filled between patterns of the lead frame 23 so as to be flush with the surface of the lead frame 23 as shown in FIG. 2D. At the same time, the thermosetting resins in the first sheet-like thermal conductive resin composition 21a and the second sheet-like thermal conductive resin composition 22a are cured and integrated so as to be a first electrical insulator layer 21 and a second electrical insulator layer 22, thus completing the thermal conductive substrate. Even when there is no heat-radiating board 24, a similar method can complete the substrate.

At the time of heating and pressing mentioned above, it is sufficient that the first thermal conductive resin composition 21a is filled so as to cover the end faces of the circuit patterns of the lead frame 23 in a portion where the circuit patterns are in contact with the first thermal conductive resin composition 21a. This is preferable in terms of the adhesive strength of the insulator layer to the lead frame. It is further preferable that the first sheet-like thermal conductive resin composition 21a is filled between patterns of the lead frame 23 so as to be flush with the surface of the lead frame 23 as shown in FIGS. 1 and 2D. This makes it easy to perform after-treatment such as leveling or solder resist processing of the substrate surface, and improves the packaging characteristics when components are packaged between the circuit patterns.

The method for forming the thermal conductive resin composition into a sheet is not limited specifically, and can be a doctor blade method, coating, extrusion or the like. After solvent is mixed in the thermal conductive resin composition so as to adjust its viscosity, the thermal conductive resin composition may be formed into a sheet, and then the solvent may be dried at the temperature lower than the curing temperature of the thermosetting resin in the thermal conductive resin composition. In this case, the doctor blade method is preferable because the forming of the sheet is easy. For example, methyl ethyl ketone (MEK), toluene or isopropanol can be used as the solvent.

Second Embodiment

Figure 3A:
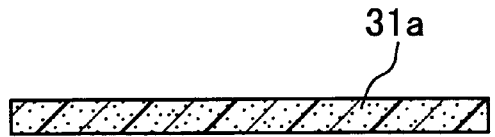
FIGS. 3A to 3D are sectional views illustrating the steps for manufacturing a thermal conductive substrate in accordance with a second embodiment of he present invention.
Figure 3B:
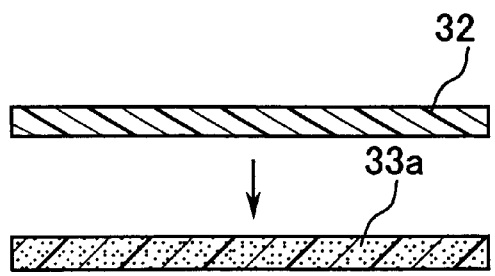
Figure 3C:
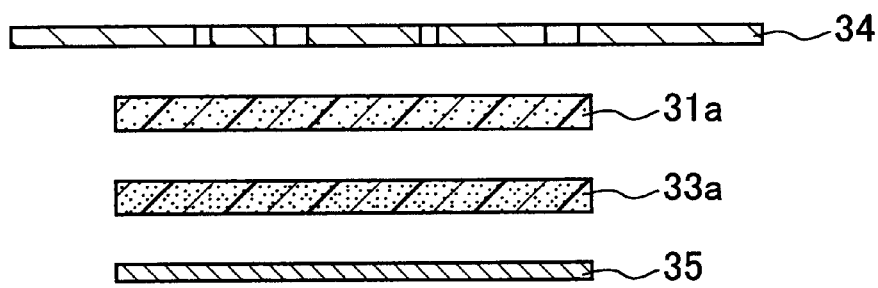
Figure 3D:
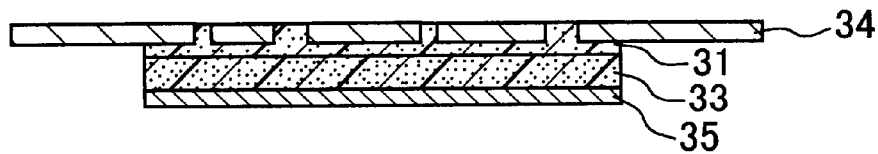

FIGS. 3A to 3D are sectional views illustrating the steps for manufacturing a thermal conductive substrate in accordance with the second embodiment of the present invention. As shown in 3A, a first thermal conductive resin composition is processed into a sheet by a method similar to that described in FIG. 2A so as to prepare a first sheet-like thermal conductive resin composition 31a. As shown in FIG. 3B, a reinforcing material 32 is prepared so as to be impregnated with a mixture containing an inorganic filler and a thermosetting resin that is not cured, thus preparing a second sheet-like thermal conductive resin composition 33a. As shown in FIG. 3C, a lead frame 34, the first sheet-like thermal conductive resin composition 31a, the second sheet-like thermal conductive resin composition 33a and a heat-radiating board 35 are stacked. When this is heated and pressed, the first sheet-like thermal conductive resin composition 31a is filled between patterns of the lead frame 34 so as to be flush with the surface of the lead frame 34 as shown in FIG. 3D. At the same time, the thermosetting resins in the first sheet-like thermal conductive resin composition 31a and the second sheet-like thermal conductive resin composition 33a are cured and integrated so as to be a first electrical insulator layer 31 and a second electrical insulator layer 33, thus completing the thermal conductive substrate. Even when there is no heat-radiating board 35, a similar method can complete the substrate.

As the reinforcing material, fabric using, for example, ceramic fiber, glass fiber or resin fiber can be used. In particular, fabric using ceramic fiber or glass fiber is preferable. Ceramic and glass are highly reliable due to their high thermal stability, and achieve excellent thermal conductivity because they have higher thermal conductivity than resins. For example, alumina, silica or silicon nitride can be used as the ceramic.

In addition, when the fiber mentioned-above is used, it is preferable that the reinforcing material is a non-woven fabric. Since the reinforcing material of non-woven fabric is less dense and more porous than that of woven fabric, it takes in the inorganic filler more easily when it is impregnated with the mixture of the thermosetting resin and the inorganic filler, making it easier to impregnate the reinforcing material with the mixture without changing its composition ratio.

Furthermore, it is preferable that the diameter of the fiber is 20 $\mu$m or smaller. When it is larger, the compressibility during the formation of the substrate decreases. Consequently, it is likely that the thermal conductivity between the inorganic fillers is hindered. This tends to increase the heat resistance of the substrate.

In accordance with the present embodiment, since the reinforcing material is contained in the second thermal conductive resin composition, it is easy to handle the sheet-like thermal conductive resin compositions. Therefore, even when the ratio of the inorganic filler is raised in order to obtain high thermal conductivity, for example, it is unlikely to cause breaking and cracking of the sheet, thus making it possible to produce the substrate easily. Also, the reinforcing material improves the substrate strength. Furthermore, a material with excellent thermal conductivity such as ceramics is used as the reinforcing material, thereby improving the heat-radiating characteristics of the substrate.

Third Embodiment

FIGS. 4A to 4D are sectional views illustrating the steps for manufacturing a thermal conductive substrate in accordance with the third embodiment of the present invention. As shown in FIG. 4A, a first thermal conductive resin composition is processed into a sheet by a method similar to that described in FIG. 2A so as to prepare a first sheet-like thermal conductive resin composition 41a. As shown in FIG. 4B, a second thermal conductive resin composition having higher thermal conductivity than the first thermal conductive resin composition is processed into a layer having a substantially constant thickness, then adhered onto a heat-radiating board 43, so as to form a thermal conductive resin composition layer 42a, thus obtaining a heat-radiating board 44 provided with the thermal conductive resin composition. Subsequently, as shown in FIG. 4C, a lead frame 45, the first sheet-like thermal conductive resin composition 41a, the heat-radiating board 44 provided with the thermal conductive resin composition are stacked. When this is heated and pressed, a first electrical insulator layer 41 and a second electrical insulator layer 42 are formed as shown in FIG. 4D, thus completing the thermal conductive substrate similar to that in the embodiment described using FIG. 2D.

The method for processing the thermal conductive resin composition into a layer on the heat-radiating board 43 can be selected suitably according to the state of the thermal conductive resin compositions. For example, a method of printing a paste-like thermal conductive resin composition, a method of adhering a highly viscous paste-like thermal conductive resin composition by heating and pressing, or a method of adhering a powder thermal conductive resin composition by heating and pressing can be used. In particular, the method of adhering the paste-like or powder thermal conductive resin composition by heating and pressing is preferable.

When using the method of printing the paste-like thermal conductive resin composition, the position where the thermal conductive resin composition is arranged on the heat-radiating board 43 is restricted, then the thermal conductive resin composition that has been processed to be a paste-like form is printed so as to be processed into a sheet. The determined position of the thermal conductive resin composition can be restricted using, for example, a metal mask. The method for processing the thermal conductive resin composition into a paste-like form is not limited specifically. The viscosity may be adjusted suitably to make it easier to print the thermal conductive resin composition. In particular, it is preferable that a solvent is mixed with the thermal conductive resin composition so that its viscosity is adjusted. This is because this method makes it easier to adjust the viscosity. For example, methyl ethyl ketone (MEK), toluene or isopropyl alcohol can be used as the solvent. In addition, it is preferable that, after adhering the thermal conductive resin composition to the heat-radiating board 43, a heat treatment is performed at the temperature lower than the curing temperature of the thermosetting resin in the thermal conductive resin composition. With this step, not only the solvent, which is added for adjusting the viscosity, can be dried, but also tack of the thermal conductive resin composition can be removed, thus achieving easier handling. Moreover, this heat treatment also may be performed in a vacuum in order to reduce voids in the thermal conductive resin composition layer 42a.

Also, for example, when using the method of adhering the highly viscous paste-like thermal conductive resin composition by a thermo-compression bonding, the shape of the thermal conductive resin composition is restricted so as to be a layer, followed by heating and pressing with the heat-radiating board. This makes it possible to process the thermal conductive resin composition into a layer having a substantially constant thickness, so as to be adhered to the heat-radiating board. The shape of the thermal conductive resin composition can be restricted to be a layer using, for example, a mold. In addition, the heating and pressing can be performed using, for example, a heat press machine.

In addition, for example, when using the method of adhering the powder thermal conductive resin composition by a thermo-compression bonding, the thermal conductive resin composition is heated so as to lower the viscosity of the thermosetting resin therein, thus increasing its adhesive characteristics. At the same time, the thermal conductive resin composition is restricted so as to be a layer, followed by pressing. Thus, the thermal conductive resin composition can be processed into a layer having a substantially constant thickness on the heat-radiating board. The thermal conductive resin composition can be restricted to be a layer using, for example, a mold, and adhered by the thermo-compression bonding using, for example, a heat press machine.

In accordance with the present embodiment, since the second thermal conductive resin composition does not have to be processed into a sheet, the substrate can be produced in a simple manner. Also, even when using a thermal conductive resin composition that is powder at a normal temperature and difficult to be processed into a layer, such as a thermal conductive resin composition using a thermosetting resin that is solid at a normal temperature, the substrate can be produced easily.

In the present embodiment described above, when the thermosetting resins in the first sheet-like thermal conductive resin composition 41a and the thermal conductive resin composition layer 42a are not cured in FIG. 4C, then the resins are cured by heating and pressing so as to integrate them, thereby completing the substrate. However, in FIG. 4C, the thermosetting resin in the thermal conductive resin composition layer 42a already may be cured as long as the first sheet-like thermal conductive resin composition 41a is not cured.

Fourth Embodiment

Figure 5A:
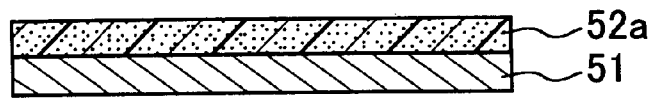
FIGS. 5A to AD are sectional views illustrating the steps for manufacturing a thermal conductive substrate in accordance with a fourth embodiment of the present invention.
Figure 5B:
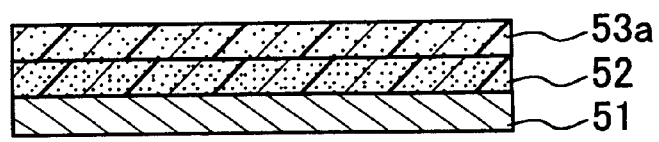
Figure 5C:
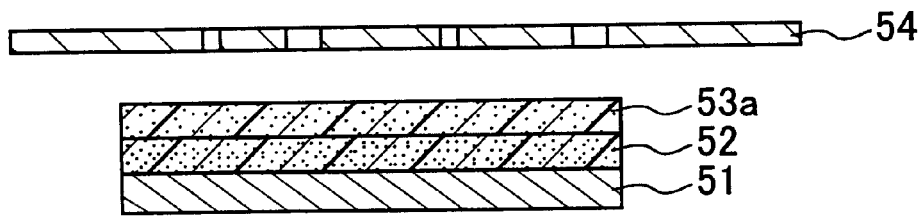
Figure 5D:
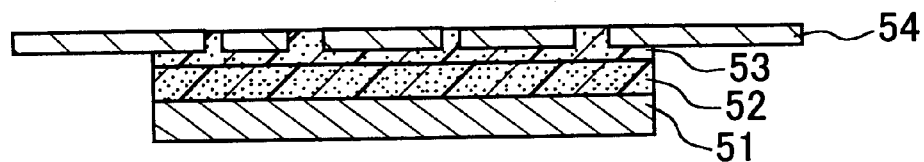
Figure 6A:
FIGS. 6A to 6B are sectional views illustrating the steps for manufacturing a conventional thermal conductive substrate.
Figure 6B:
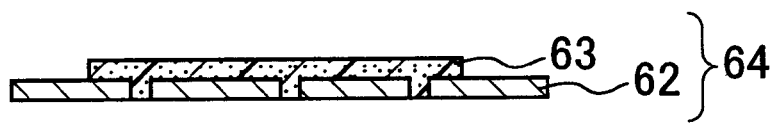

FIGS. 5A to 5D are sectional views illustrating the steps for manufacturing a thermal conductive substrate in accordance with the fourth embodiment of the present invention. As shown in FIG. 5A, a second thermal conductive resin composition is processed into a layer having a substantially constant thickness, then adhered onto a heat-radiating board 51, so as to form a second thermal conductive resin composition layer 52a. As shown in FIG. 5B, a first thermal conductive resin composition is processed into a layer having a substantially constant thickness and adhered thereon, so as to form a first thermal conductive resin composition layer 53a. On top of this, as shown in FIG. 5C, a lead frame 54 is stacked so as to contact the first thermal conductive resin composition layer 53a, followed by heating and pressing. Thus, a first electrical insulator layer 53 and a second electrical insulator layer 52 are formed as shown in FIG. 5D, thus completing the thermal conductive substrate similar to that in the embodiment described using FIG. 2D.

The thermal conductive resin composition can be processed into a layer so as to produce the first thermal conductive resin composition layer 53a and the second thermal conductive resin composition layer 52a by a method similar to that described using FIG. 4. Furthermore, for example, the second thermal conductive resin composition can be processed into a sheet by a doctor blade method using the heat-radiating board 51 as a carrier. On top of this, the first thermal conductive resin composition can be processed into a sheet using this as a carrier.

Also, before being integrated with the lead frame 54 as shown in FIG. 5C, the thermosetting resin in the first thermal conductive resin composition layer 53a is not cured, while the thermosetting resin in the second thermal conductive resin composition layer 52a already may be cured. In other words, when the first thermal conductive resin composition layer 53a is processed into a layer on the second thermal conductive resin composition layer 52a as shown in FIG. 5B, the second thermal conductive resin composition layer 52a may be cured in advance. This is preferable because the first thermal conductive resin composition layer 52a can be processed into a layer having a substantially constant thickness more easily.

In the above embodiments, the temperature during heating and pressing can be selected according to the curing temperature of the thermosetting resins, but preferably is 140 to 260° C. When the temperature is lower than this, the resin is cured inadequately. When the temperature is higher, the resin starts to decompose. In addition, it is preferable that the pressure is 1 to 20 MPa. When the pressure is lower than this, the insufficient pressure makes it difficult to fill the thermal conductive resin composition so as to be flush with the surface of the lead frame and be integrated, deteriorating the electrical insulation characteristics and the thermal conductivity of the thermal conductive substrate. When the pressure exceeds this range, it is more likely that fracture occurs in the formed article.

Also, in the above embodiments, the thickness of the thermal conductive substrate when formed can be selected according to external shapes and heat dissipation characteristics of a module using the substrate. It is preferable that the thickness of the insulator layer (the distance between the lead frame and the heat-radiating board) is at least 0.4 mm. This provides the substrate with a reinforced insulation, thus further improving insulation reliability.

Furthermore, in the above embodiments, in order to achieve the object of the present invention of obtaining high heat-radiating characteristics, it is preferable that the second insulator layer is thicker than the first insulator layer. In particular, it is preferable that the thickness of the first insulator layer is equivalent to or smaller than a quarter of the thickness of the entire insulator layer. Furthermore, it is more preferable that the thickness of the first insulator layer is equivalent to or smaller than 0.1 mm. When the first insulator layer is thicker than this, the heat-radiating characteristics of the substrate is deteriorated considerably.

In above embodiments, it is preferable that the resin composition contains at least epoxy resin that is solid at a room temperature, epoxy resin that is liquid at a room temperature, hardener and hardening accelerator. With the use of these, it is possible to produce a paste-like thermal conductive resin composition with excellent printing characteristics. In addition, this is formed into a film, followed by heat treatment at a temperature lower than the curing temperature of the epoxy resin. Thus, it is possible to produce a sheet-like thermal conductive resin composition without tack and with excellent flexibility. Since these resin compositions are easily dissolved in the solvent, it is easy to adjust the viscosity thereof. Also, these resin compositions can be processed into a highly viscous paste-like (clay-like) form so as to produce kneaded material easily.

Moreover, in the above structure, it is preferable that at least one selected from the group consisting of bisphenol A type epoxy resin and bisphenol F type epoxy resin is contained as a main component of the epoxy resin that is liquid at a room temperature. This makes it possible to produce the thermal conductive substrate with excellent thermal stability and strength. The main component mentioned above indicates preferably 30 at least 25 wt %, and more preferably at least 40 wt %.

Furthermore, in the above structure, it is preferable that the hardener is acid anhydride. This is because the viscosity of the thermal conductive resin composition can be lowered.

Also, in the above embodiments, it is preferable that the resin composition contains brominated polyfunctional epoxy resin as a main component, and further contains bisphenol A type novolac resin as the hardener and imidazole as the hardening accelerator. This is because the above structure achieves excellent thermal stability as well as flame retardancy.

In the above embodiments, it is preferable that at least one selected from the group consisting of a coupling agent, a dispersing agent, a coloring agent and a releasing agent is further added to the resin composition. The coupling agent is preferable because it improves adhesive strengths of the inorganic filler, the lead frame and the heat-radiating board to the thermosetting resin compositions, thereby improving the withstand voltage of the thermal conductive substrate. For example, an epoxysilane coupling agent, an aminosilane coupling agent or a titanate coupling agent can be used as the coupling agent. The dispersing agent is preferable because it improves the dispersibility of the thermal conductive resin composition, achieving homogenization. For example, phosphate ester can be used as the dispersing agent. The coloring agent is preferable because it colors the thermal conductive resin composition, thereby improving its thermal radiation characteristics. For example, carbon can be used as the coloring agent.

In addition, in the above embodiments, it is preferable that at least the surface of the heat-radiating board to be adhered to the thermal conductive resin composition is roughened. This is because the adhesive strength is improved, leading to higher reliability of the substrate. The method of roughening is not limited specifically, and can be sand blasting or etching. In particular, the sand blasting is preferable because it can roughen the surface easily so as to produce a highly roughened surface, thereby improving the adhesive strength considerably.

The embodiments described above are not considered to limit the present invention. The invention may be embodied in other specific forms without departing from the spirit or essential characteristics thereof being indicated by the appended claims.

As described above, in accordance with the present invention, while maintaining fluidity necessary for filling the thermal conductive resin composition between patterns of the lead frame serving as the wiring pattern so as to cover the side portions thereof and to be flush with the surface of the lead frame, the thermal conductivity of the substrate can be improved. The thermal conductive resin composition is prepared by filling the inorganic filler in the resin composition containing the thermosetting resin so as to achieve a high concentration. In addition, the use of the reinforcing material makes it possible to achieve higher strength of the substrate while maintaining its low heat resistance, leading to still easier handling of insulating materials during forming. Thus, it is possible to produce the substrate with high reliability, insulation characteristics and heat-radiating characteristics.

EXAMPLE

The following is a more detailed description of the thermal conductive substrate of the present invention and the method for manufacturing the same, with reference to specific examples.

Example 1

In order to produce a first thermal conductive resin composition used for carrying out the present invention, an inorganic filler and a thermosetting resin composition were mixed and processed to form a slurry. The composition of the first thermal conductive resin composition that was mixed was as follows:

(1) Inorganic filler: $Al_2O_3$ (AS-40, manufactured by Showa Denko K.K., mean particle size of 12 $\mu$m) 89 wt %
(2) Thermosetting resin: brominated polyfunctional epoxy resin (NVR-1010, manufactured by Japan Rec Co., Ltd., hardener contained) 10 wt %
(3) Other additives: hardening accelerator (imidazole, manufactured by Japan Rec Co., Ltd.) 0.05 wt %, carbon black (manufactured by Toyo Carbon Co., Ltd.) 0.4 wt %, coupling agent (PLENACT KR-46B, manufactured by Ajinomoto Co., Inc.) 0.55 wt %

Methyl ethyl ketone (MEK) was added to these materials as a solvent, then mixed using a stirring-deforming machine (manufactured by Matsuo Sangyo Co., Ltd.). The addition of MEK lowered the viscosity of the mixture, thereby allowing the processing into slurry. However, MEK was not included in the blend composition above because it was removed in a subsequent drying step.

With a doctor blade method, this slurry was formed into a film on a releasing film of polyethylene terephthalate (PET), which surface was processed to be releasable. Subsequently, the film was dried at 95° C., followed by scattering the solvent, thereby producing a first sheet-like thermal conductive resin composition formed of the first thermal conductive resin composition as shown in FIG. 2A.

Next, the materials similar to those in the first thermal conductive resin composition were used, but the blend ratio thereof was changed. This was mixed and processed to be slurry. The composition of a second thermal conductive resin composition that was mixed was as follows:
(1) Inorganic filler: 94 wt %
(2) Thermosetting resin: 5.6 wt %
(3) Other additives: hardening accelerator 0.02 wt %, coupling agent 0.38 wt %

The carbon black as a coloring agent was removed.

These materials were formed into a sheet by a method similar to that of the first thermal conductive resin composition, so as to produce a second sheet-like thermal conductive resin composition formed of the second thermal conductive resin composition.

An aluminum plate having a thickness of 1 mm was prepared as a heat-radiating board, and the surface thereof was roughened by sand blasting (abrasive powder: $Al_2O_3$, Morandum A-40 (trade name), manufactured by Showa Denko K.K.). Furthermore, a copper plate having a thickness of 0.5 mm (manufactured by Kobe Steel Ltd.) was etched by a known method so as to form circuit patterns. This was plated with nickel, thus preparing a lead frame. One side of the lead frame was processed by sand blasting in a manner similar to that of the aluminum plate described above.

As shown in FIG. 2C, the lead frame, the first- sheet-like thermal conductive resin composition, the second sheet-like thermal conductive resin composition and the heat-radiating board were stacked in this order so that the roughened surfaces of the lead frame and the heat-radiating board contact the sheet-like thermal conductive resin compositions. This was heated at 170° C. and pressed at 5 MPa for 15 minutes. Accordingly, the thermal conductive resin composition flowed to the surface of the lead frame, while the thermosetting resin in the thermal conductive resin composition was cured to be rigid, thereby completing a substrate having a thickness of 2.5 mm (the thickness of an insulator layer was 1.0 mm) as shown in FIG. 2D. Subsequently, components will be packaged by steps such as solder resist processing, frame cutting and terminal processing. However, since these steps can be conducted by known techniques, the explanation thereof is omitted here.

The thickness of the first and second sheet-like thermal conductive resin compositions was changed so as to produce substrates of Experiments a to d. Also, as Comparative example 1, the first thermal conductive resin composition alone was used to produce a substrate having a thickness of 2.5 mm by a similar method as above. As Comparative example 2, the second thermal conductive resin composition alone was used to produce a substrate having a thickness of 2.5 mm by a similar method as above. However, in Comparative example 2, it was not possible to fill the thermal conductive resin composition between patterns of the lead frame sufficiently, thus creating unevenness in the substrate surface. Thus, the end faces of the lead frame were not covered with the thermal conductive resin composition in a portion where the lead frame was in contact with the thermal conductive resin composition.

The heat resistance, insulation resistance and peel strength of terminals of the substrates in Example 1

(Experiments a to d) and Comparative examples 1 and 2 were measured. Table 1 shows the results of these measurements.

TABLE 1

| Experiment | | Thickness of electrical insulator layer (mm) | | Heat resistance (°C./W) | Electrical insulation resistance (Ω) | Peel strength (kgf) | Surface appearance |
|---|---|---|---|---|---|---|---|
| | | First insulator layer | Second insulator layer | | | | |
| Comparative example 1 | — | 1.0 | 0 | 1.36 | $2 \times 10^{13}$ | 4.1 | Flat |
| Example 1 | a | 0.75 | 0.25 | 1.34 | $2 \times 10^{13}$ | 4.2 | Flat |
| | b | 0.50 | 0.50 | 1.32 | $1 \times 10^{13}$ | 4.0 | Flat |
| | c | 0.25 | 0.75 | 1.25 | $9 \times 10^{12}$ | 4.1 | Flat |
| | d | 0.1 | 0.9 | 1.16 | $6 \times 10^{12}$ | 4.0 | Flat |
| Comparative example 2 | — | 0 | 1.0 | 1.28 | $3 \times 10^{9}$ | 1.8 | Uneven |

The heat resistance was measured by a heat resistance measuring device (manufactured by CATS Inc.). A semiconductor (TO-220) was attached onto the same patterns of the lead frame, and the heat-radiating board was adhered to a heat sink provided with a fin as an ideal constant temperature reservoir. When applying a constant electric power to the semiconductor, the voltage in a PN junction of the semiconductor changed. The change in the semiconductor temperature was estimated from the voltage change above, and the temperature difference was divided by the electric power so as to obtain values of the heat resistance. After applying the potential difference of 50 V between the lead frame and the heat-radiating board, the insulation resistance was measured by an insulation resistance measuring device (manufactured by Advantest Corporation). In addition, the peel strength of the terminals was measured in the following manner. When a terminal pattern having a width of 1.5 mm was selected from the patterns of the lead frame and was peeled in the direction perpendicular to the substrate, the strength of this terminal was measured.

Table 1 shows that the substrate had excellent heat-radiating characteristics, because the heat resistance of the substrates in Example 1 was lower than that in Comparative example 1 and could be made equivalent to or lower than that in Comparative example 2. Table 1 also shows that every insulation resistance was high enough, and the substrate achieved sufficient characteristics. Also, the peel strengths were equivalent to those in Comparative example 1. These values were high enough to prevent terminals from detaching or coming apart due to terminal processing such as cutting or bending, indicating an excellent adhesion of the lead frame to the thermal conductive resin composition. As described above, in accordance with the example of the present invention, it was possible to achieve higher heat-radiating characteristics than that of the substrate formed of the first thermal conductive resin composition with excellent adhesive and heat-radiating characteristics alone (Comparative example 1), and also to achieve, lower heat resistance, higher adhesive strength and higher insulation characteristics than those of the substrate formed of the second thermal conductive resin composition with still higher heat-radiating characteristics alone (Comparative example 2), when the substrate was formed by integrating the thermal conductive resin compositions with the lead frame.

Table 1 also shows that, by comparing the results of the Experiments a to d, all of them had sufficient insulation resistance and peel strength as a substrate. Moreover, as the first electrical insulator layer became thinner, the heat resistance decreased. In Experiments c and d, which were preferable examples, the effect of reducing the heat resistance was large. Furthermore, in Experiment d, which was a more preferable example, the heat resistance decreased considerably. As described above, it was shown that the thermal conductive substrate of the present invention achieved a considerable improvement of heat-radiating characteristics when the thickness of the insulator layer was appropriate.

In addition, Table 1 showed that, in Comparative example 2, since the end faces of the lead frame were not covered with the thermal conductive resin composition, the peel strength was much lower than that of Example 1. It was shown that the thermal conductive substrate of the present invention improved the peel strength considerably by means of covering the end faces of the lead frame with the thermal conductive resin composition in a portion where the lead frame was in contact with the thermal conductive resin composition.

In order to evaluate the reliability of the substrate, 100 cycles of a temperature cycling test from −40° C. to 125° C. were conducted. No crack was generated in the thermal conductive resin composition in the thermal conductive substrate, of the present example. Also, nothing unusual was found in an observation of the interface of the thermal conductive resin composition and the lead frame with an ultrasonic exploratory video system, so it was confirmed that a strong adherence was obtained. Furthermore, the measurement of the insulation resistance found no change from the initial values, confirming that high insulation characteristics was maintained. As a result, it was shown that the thermal conductive substrate of the present invention had high reliability.

The thermal conductivity of the first and second thermal conductive resin compositions was examined in the following manner. After each thermal conductive resin composition was formed into a plate-like shape and cured, a semiconductor was attached onto the plate, so as to measure the thermal resistance. Also, the inorganic filler ratio of the first and second thermal conductive resin compositions was examined by a weight ratio of the thermal conductive resin composition and residue of the thermal conductive resin composition after being burned. In addition, the thickness of the first and second insulator layers was determined by observing a cross-section of the formed article.

For example, in order to measure the thermal conductivity of the insulator layer, the first and second insulator layers of Example 1 were sandwiched respectively from both sides by copper foils having a thickness of 35 μm, and further sandwiched by flat plates having openings with a constant gap, then heated at a temperature not higher than 175° C. and pressed at 3 MPa for 60 minutes, thus producing insulators provided with copper foils. The thickness of these insulator layers was 0.50 mm. This insulator was cut into squares (10 mm×10 mm). A semiconductor was soldered to one side thereof, and a heat sink provided with a fin was adhered to the other side. The heat resistance of the insulator was measured by a method similar to that of measuring the heat resistance described above. From this heat resistance and the heat resistance that was obtained by subtracting the heat resistance between the semiconductor package copper foils and the contact heat resistance between a sample and the heat sink that were measured in advance, the thermal conductivity of the insulator was calculated. The result of the calculation showed that the first insulator had a thermal conductivity of 4.1 W/m·K, and that the second insulator had a thermal conductivity of 7.6 W/m·K.

Example 2

As a first thermal conductive resin composition used for carrying out the present invention, the first thermal conductive resin composition described in Example 1 was used. Also, a mixture was formed in the composition equivalent to the second thermal conductive resin composition used in Example 1, followed by adding MEK to adjust the viscosity. After a reinforcing material of varying type was impregnated with the above mixture, this was dried at 120° C. for 5 minutes so as to remove MEK. Thus, a second thermal conductive resin composition having a thickness of about 0.8 mm as shown in FIG. 3B was obtained.

Using these materials along with the lead frame and the heat-radiating board as in Example 1, a substrate having a thickness of 2.5 mm (the thickness of an insulator layer was 1.0 mm) as shown in FIG. 3D was completed with the method similar to that in Example 1. The thickness of the first and second insulator layers was equivalent to that of Experiment c in Example 1.

Types of the reinforcing materials were changed so as to produce substrates of Experiments e to j. The heat resistance of these substrates was measured with the method similar to that in Example 1. Table 2 shows the results of these measurements.

TABLE 2

| | Reinforcing material | | | Heat |
| Experiment | Type | Fiber diameter ($\mu$m) | Fiber length (mm) | resistance (° C./W) |
| --- | --- | --- | --- | --- |
| e | Alumina woven fabric | 10 | — | 1.08 |
| f | Alumina non-woven fabric | 10 | 15 | 1.06 |
| g | Glass woven fabric | 9 | — | 1.33 |
| h | Glass non-woven fabric | 9 | 13 | 1.28 |
| i | Glass non-woven fabric | 6 | 13 | 1.26 |
| j | Glass non-woven fabric | 12 | 13 | 1.39 |

Table 2 shows that, by comparing Experiments e with g, the substrate using the alumina woven fabric with higher thermal conductivity achieved lower heat resistance when using woven fabrics with substantially the same fiber diameters. It also was shown that, by comparing Experiments e and f with g and h, the substrates using the non-woven fabric for the reinforcing material achieved lower heat resistance than those using the woven fabric when both had the same fiber diameters. Furthermore, it was shown that, by comparing Experiments h to j, the heat resistance increased more considerably when the fiber diameter was 12 $\mu$m than when the fiber diameter was 9 $\mu$m or smaller.

As described above, the use of the reinforcing material of ceramic or glass fiber made it possible to achieve the substrate with low heat resistance. Also, especially when the reinforcing material was non-woven fabric, the heat resistance decreased. When the fiber diameter was equivalent to or smaller than 10 $\mu$m, the heat resistance decreased considerably.

In order to evaluate the reliability of the substrate, 100 cycles of a temperature cycling test from −40° C. to 125° C. were conducted. No crack was generated in the thermal conductive resin composition in the thermal conductive substrate of the present example. Also, nothing unusual was found in an observation of the interface of the thermal conductive resin composition and the lead frame and that of the thermal conductive resin composition and the heat-radiating board with an ultrasonic exploratory video system, so it was confirmed that a strong adherence was obtained. As a result, it was shown that the thermal conductive substrate of the present invention had high reliability.

Example 3

In order to produce a second thermal conductive resin composition used for carrying out the present invention, an inorganic filler and a thermosetting resin were mixed to obtain a paste-like composition. The composition of this thermal conductive resin composition was as follows:

(1) Inorganic filler: $Al_2O_3$ (AL-33, manufactured by Sumitomo Chemical Co., Ltd., mean particle size of 12 $\mu$m) 93 wt %

(2) Thermosetting resin: epoxy resin (WE-2025 (trade name), manufactured by Nippon Pelnox Corporation, acid anhydride hardener contained) 6.2 wt %

(3) Other additives: dispersing agent ("PLYSURF, A208F" (trade name) manufactured by Dai-ichi Kogyo Seiyaku Co., Ltd.) 0.3 wt %, reactive diluent (Cardula E10, manufactured by Yuka Shell Epoxy Co., Ltd.) 0.5 wt %

Such a blended resin composition was kneaded sufficiently with a three roll mill and processed into a paste-like form. The viscosity here was about 100 Pa·s (25° C.).

Next, an aluminum plate having a thickness of 1 mm was prepared as a heat-radiating board, and a SUS mask that had an opening in a position corresponding to a desired portion of the aluminum plate to be printed was prepared. The aluminum plate and the mask were stacked and placed on a printing stage. A second thermal conductive resin composition that had been processed into a paste-like form in advance was put on this mask, and the thermal conductive resin composition was printed and filled in the opening of the mask by pressing a SUS squeegee against the mask. Subsequently, the mask was removed, and while removing voids in the thermal conductive resin composition by a heat treatment in a vacuum, the thermosetting resin in the thermal conductive resin composition was semi-cured so as to remove tack. Thus, the heat-radiating board provided with the second thermal conductive resin composition as shown in FIG. 4B was completed. The thickness of the thermal conductive resin composition layer here was about 0.4 mm.

Next, the materials having the same composition as the first thermal conductive resin composition in Example 1 were used to produce a first sheet-like thermal conductive resin composition as shown in FIG. 4A in a manner similar to that in Example 1.

Then, a copper plate having a thickness of 0.5 mm (manufactured by Kobe Steel Ltd.) was etched by a known method so as to form circuit patterns. This was plated with nickel and then with tin, thus preparing a lead frame. One side of the lead frame was processed by sand blasting as in Example 1.

As shown in FIG. 4C, the lead frame, the first sheet-like thermal conductive resin composition and the heat-radiating board provided with the second thermal conductive resin composition were stacked in this order, and heated at 150° C. and pressed at 5 MPa for 30 minutes, thereby completing a thermal conductive substrate having a thickness of 2.0 mm (the thickness of an insulator layer was 0.5 mm) as shown in FIG. 4D.

When the heat resistance of the thermal conductive substrate of the present example was measured by a method similar to that in Example 1, it was 0.57° C./W. Using the same heat-radiating board and the lead frame as in the present example, the first thermal conductive resin composition alone was used as insulation so as to produce a thermal conductive substrate having a thickness of 2.0 mm by a method similar to that in Comparative example 1. This thermal conductive substrate had a heat resistance of 0.66° C./W, confirming that the substrate in the present example had excellent heat dissipation characteristics. Also, using the same heat-radiating board and the lead frame as in the present example, the second thermal conductive resin composition of the present example alone was used as insulation so as to produce a heat-radiating board provided with a thermal conductive resin composition. Then, the lead frame was stacked on the second thermal conductive resin composition, followed by heating and pressing as in the present example. This thermal conductive resin composition was not filled to the surface of the lead frame so that the surface became uneven.

In order to evaluate the reliability of the substrate, 100 cycles of a temperature cycling test from −40° C. to 125° C. were conducted. No crack was generated in the thermal conductive resin composition in the thermal conductive substrate of the present example. Also, nothing unusual was found in an observation of the interface of the thermal conductive resin composition and the lead frame with an ultrasonic exploratory video system, so it was confirmed that a strong adherence was obtained.

Example 4

In order to produce a second thermal conductive resin composition used for carrying out the present invention, an inorganic filler and a thermosetting resin were kneaded to obtain a clay-like thermal conductive resin composition. The composition was as follows:
(1) Inorganic filler: AlN (SCAN 70, manufactured by The Dow Chemical Company) 36 wt %, $Al_2O_3$ (As-40, manufactured by Showa Denko K.K.,) 55 wt %
(2) Thermosetting resin: epoxy resin (XNR 5002, manufactured by Nagase-Ciba K.K.) 8.5 wt %
(3) Other additives: silane coupling agent (A-187, manufactured by Unicar Co., Ltd.) 0.3 wt %, carbon black (manufactured by Toyo Carbon Co., Ltd.) 0.2 wt %

The above materials were blended, followed by adding MEK to slightly lower the viscosity. Subsequently, this was kneaded with a planetary mixer and with a three roll mill, then dried in a vacuum to remove MEK, thus producing a clay-like thermal conductive resin composition. Also, an aluminum plate having a thickness of 1.0 mm was prepared as a heat-radiating board. Both sides thereof were roughened by a method similar to that in Example 1.

Next, a releasing film of PPS (polyphenylene sulfide) was placed on a mold. The thermal conductive resin composition described above was weighed and put over the releasing film. Furthermore, the aluminum plate described above was placed thereover. Then, a punch was inserted so as to heat and press the mold at 80° C. and at 10 MPa. This adhered the thermal conductive resin composition to the heat-radiating board as a layer having a substantially constant thickness, at the same time, the thermosetting resin became semi-cured so as to reduce its tack. Subsequently, the thermal conductive resin composition was removed from the mold, completing the heat-radiating board provided with the thermal conductive resin composition as shown in FIG. 4B. The thickness of the thermal conductive resin composition layer here was about 1.0 mm.

Next, the materials having the same composition as the first thermal conductive resin composition in Example 1 were used as a first thermal conductive resin composition shown in FIG. 4A, thus producing a first sheet-like thermal conductive resin composition in a manner similar to that in Example 1.

Then, a copper plate having a thickness of 0.8 mm (manufactured by Kobe Steel Ltd.) was etched by a known method so as to form circuit patterns. This was plated with nickel, thus preparing a lead frame. One side of the lead frame was processed by sand blasting as in Example 1. Subsequently, as shown in FIG. 4C, the lead frame, the first sheet-like thermal conductive resin composition and the heat-radiating board provided with the second thermal conductive resin composition were stacked in this order, and heated at 170° C. and pressed at 8 MPa for 60 minutes, thereby completing a thermal conductive substrate having a thickness of 3.0 mm (the thickness of an insulator layer was 1.2 mm) as shown in FIG. 4D.

When the heat resistance of the thermal conductive substrate of the present example was measured by a method similar to that in Example 1, it was 1.27° C./W. Using the same heat-radiating board and the lead frame as in the present example, the first thermal conductive resin composition alone was used as insulation so as to produce a thermal conductive substrate having a thickness of 3.0 mm by a method similar to that in Comparative example 1. When measured in a similar manner, this thermal conductive substrate had a heat resistance of 1.61° C./W, confirming that the substrate in the present example had excellent heat dissipation characteristics. Also, using the same heat-radiating board and the lead frame as in the present example, the second thermal conductive resin composition of the present example alone was used as insulation so as to produce a heat-radiating board provided with a thermal conductive resin composition. Then, the lead frame was stacked on the thermal conductive resin composition, followed by heating and pressing as in the present example. This thermal conductive resin composition was not filled to the surface of the lead frame so that the surface became uneven.

In order to evaluate the reliability of the substrate, 100 cycles of a temperature cycling test from −40° C. to 125° C. were conducted. No crack was generated in the thermal conductive resin composition in the thermal conductive substrate of the present example. Also, nothing unusual was found in an observation of the interface of the thermal conductive resin composition and the lead frame with an ultrasonic exploratory video system, so it was confirmed that a strong adherence was obtained.

Example 5

In order to produce a second thermal conductive resin composition used for carrying out the present invention, an inorganic filler and a thermosetting resin were kneaded to obtain a powder thermal conductive resin composition. The composition was as follows:

(1) Inorganic filler: AlN (TOYALNITE, manufactured by Toyo Aluminium) 43 wt %, $Al_2O_3$ (AM-28, manufactured by Sumitomo Chemical Co., Ltd.) 50 wt %

(2) Thermosetting resin: epoxy resin (NVR-1010, manufactured by Japan Rec Co., Ltd., hardener contained) 6.5 wt %

(3) Other additives: coupling agent (PLENACT KR-55, manufactured by Ajinomoto Co., Inc.) 0.3 wt %, carbon black (manufactured by Toyo Carbon Co., Ltd.) 0.2 wt %

MEK was further added to the above composition as a solvent in the ratio of 10 weight parts with respect to 100 weight parts of inorganic powder, followed by mixing. Subsequently, this was dried at 100° C. for 20 minutes to remove MEK, then pulverized to prepare a second powder thermal conductive resin composition. Also, an aluminum plate having a thickness of 1.0 mm was prepared as a heat-radiating board. Both sides thereof were roughened by a method similar to that in Example 1.

Next, a releasing film of PPS (polyphenylene sulfide) was placed on a mold. The thermal conductive resin composition described above was weighed and put over the releasing film. Furthermore, the aluminum plate was placed thereover. Then, a punch was inserted so as to heat and press the mold at 90° C. and at 10 MPa. This adhered the second powder thermal conductive resin composition to the heat-radiating board as a layer having a substantially constant thickness. Subsequently, the thermal conductive resin composition was removed from the mold, completing the heat-radiating board provided with the thermal conductive resin composition similar to that shown in FIG. 4B. The thickness of the thermal conductive resin composition layer here was about 0.9 mm.

Next, the materials having the same composition as the first thermal conductive resin composition in Example 1 were used to produce a first sheet-like thermal conductive resin composition as shown in FIG. 4A in a manner similar to that in Example 1.

Then, a copper plate having a thickness of 0.5 mm (manufactured by Kobe Steel Ltd.) was etched by a known method so as to form circuit patterns. This was plated with nickel and then with tin, thus preparing a lead frame. One side of the lead frame was processed by sand blasting as in Example 1. Subsequently, as shown in FIG. 4C, the lead frame, the first sheet-like thermal conductive resin composition and the heat-radiating board provided with the second thermal conductive resin composition were stacked in this order, and heated at 150° C. and pressed at 8 MPa for 15 minutes, thereby completing a thermal conductive substrate having a thickness of 2.5 mm (the thickness of an insulator layer was 1.0 mm) as shown in FIG. 4D.

When the heat resistance of the thermal conductive substrate of the present example was measured by a method similar to that in Example 1, it was 1.04° C./W. Using the same heat-radiating board and the lead frame as in the present example, the first thermal conductive resin composition alone was used as insulation so as to produce a thermal conductive substrate having a thickness of 2.5 mm (equivalent to that in Comparative example 1) by a method similar to that in Comparative example 1. When measured in a similar manner, this thermal conductive substrate had a heat resistance of 1.36° C./W, confirming that the thermal conductive substrate in the present example had excellent heat dissipation characteristics. Also, using the same heat-radiating board and the lead frame as in the present example, the second thermal conductive resin composition of the present example alone was used as insulation so as to produce a heat-radiating board provided with a thermal conductive resin composition. Then, the lead frame was stacked on the thermal conductive resin composition, followed by heating and pressing as in the present example. This thermal conductive resin composition was not filled to the surface of the lead frame so that the surface became uneven.

In order to evaluate the reliability of the substrate, 100 cycles of a temperature cycling test from −40° C. to 125° C. were conducted. No crack was generated in the thermal conductive resin composition in the thermal conductive substrate of the present example. Also, nothing unusual was found in an observation of the interface of the thermal conductive resin composition and the lead frame with an ultrasonic exploratory video system, so it was confirmed that a strong adherence was obtained.

Example 6

In order to produce a second thermal conductive resin composition used for carrying out the present invention, materials having the same composition as that in Example 4 were blended, followed by adding MEK to slightly lower the viscosity. Subsequently, this was mixed by a ball mill in which an alumina ball was enclosed, thus producing a slurry thermal conductive resin composition. Also, an aluminum plate having a thickness of 1.0 mm was prepared as a heat-radiating board. Both sides thereof were roughened by a method similar to that in Example 1. The thermal conductive resin composition was applied onto this heat-radiating board by curtain coating. Subsequently, this was dried at 95° C. so as to remove MEK, as well as removing tack of its surface, thus producing the heat-radiating board provided with the second thermal conductive resin composition as shown in FIG. 5A. The thickness of the thermal conductive resin composition here was about 0.9 mm.

Furthermore, in order to produce a first thermal conductive resin composition used for the present invention, MEK was added to a thermal conductive resin composition having the same composition as the first thermal conductive resin composition in Example 1, and this was kneaded sufficiently with a three roll mill so as to obtain a paste-like composition.

Next, the beat-radiating board provided with the second thermal conductive resin composition that was prepared in advance and a SUS mask that had an opening in a position corresponding to a desired portion of the heat-radiating board to be printed were prepared. The heat-radiating board and the mask were stacked and placed on a printing stage. The first thermal conductive resin composition that had been processed into a paste-like form was put on this mask, and the thermal conductive resin composition was printed and filled in the opening of the mask by pressing a SUS squeegee against the mask. Subsequently, the mask was removed, and MEK was scattered by a heat treatment at 110° C., thus completing the heat-radiating board provided with the thermal conductive resin composition as shown in FIG. 5B. The thickness of the thermal conductive resin composition layer here was about 1.2 mm.

Then, a copper plate having a thickness of 0.5 mm (manufactured by Kobe Steel Ltd.) was etched by a known method so as to form circuit patterns. This was plated with nickel, thus preparing a lead frame. One side of the lead frame was processed by sand blasting as in Example 1. Subsequently, the lead frame and the heat-radiating board provided with the thermal conductive resin composition were stacked as shown in FIG. 5C, and heated at 170° C. and pressed at 8 MPa for 30 minutes, thereby completing a thermal conductive substrate having a thickness of 2.5 mm (the thickness of an insulator layer was 1.0 mm) as shown in FIG. 5D.

When the heat resistance of the thermal conductive substrate of the present example was measured by a method similar to that in Example 1, it was 1.08° C./W.

In order to evaluate the reliability of the substrate, 100 cycles of a temperature cycling test from −40° C. to 125° C. were conducted. No crack was generated in the thermal conductive resin composition in the thermal conductive substrate. Also, nothing unusual was found in an observation of the interface of the thermal conductive resin composition and the lead frame with an ultrasonic exploratory video system, so it was confirmed that a strong adherence was obtained.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, all changes that come within the meaning and range of equivalency of the claims are intended to be embraced therein.

What is claimed is:

1. A thermal conductive substrate comprising:
    a first electrical insulator layer;
    a second electrical insulator layer; and
    a lead frame serving as a circuit pattern;
    wherein the first electrical insulator layer is formed of a thermal conductive resin composition comprising a thermosetting resin and an inorganic filler, and is joined to the lead frame,
    the second electrical insulator layer is provided on a side of the first electrical insulator layer not in contact with the lead frame, and is formed of a thermal conductive resin composition comprising the inorganic filler and a resin composition comprising the thermosetting resin,
    the second electrical insulator layer has a higher thermal conductivity than the first electrical insulator layer, and
    a portion of the lead frame is embedded in the first electrical insulator layer.

2. The thermal conductive substrate according to claim 1, wherein the second electrical insulator layer has a higher blend ratio of the inorganic filler than the first electrical insulator layer.

3. The thermal conductive substrate according to claim 1, wherein the first electrical insulator layer has a ratio of the inorganic filler of 70 to 95 wt %.

4. The thermal conductive substrate according to claim 1, wherein the inorganic filler is at least one powder selected from the group consisting of $Al_2O_3$, MgO, BN, $Si_3N_4$, AlN, $SiO_2$ and SiC.

5. The thermal conductive substrate according to claim 1, wherein the inorganic filler has a mean particle size ranging from 0.1 to 100 $\mu$m.

6. The thermal conductive substrate according to claim 1, wherein the second electrical insulator layer is thicker than the first electrical insulator layer.

7. The thermal conductive substrate according to claim 1, wherein a total thickness of the first and second electrical insulator layers is at least 0.4 mm, and the first electrical insulator layer has a thickness of not larger than 0.1 mm.

8. The thermal conductive substrate according to claim 1, wherein the second electrical insulator layer further comprises a reinforcing material.

9. The thermal conductive substrate according to claim 8, wherein the reinforcing material is a non-woven fabric or a woven fabric of a ceramic fiber or a glass fiber.

10. The thermal conductive substrate according to claim 9, wherein the fiber diameter is not larger than 20 $\mu$m.

11. The thermal conductive substrate according to claim 1, wherein the first electrical insulator layer has a thermal conductivity of at least 1 W/m·K (Watt/Meter·Kelvin) and not higher than 5 W/m·K, and the second electrical insulator layer has a thermal conductivity of higher than 5 W/m·K and not higher than 15 W/m·K.

12. The thermal conductive substrate according to claim 1, wherein an end face of the circuit pattern of the lead frame is covered with the first electrical insulator layer in a portion where the circuit pattern is in contact with the first electrical insulator layer.

13. The thermal conductive substrate according to claim 1, wherein the lead frame is embedded in the first electrical insulator layer so as to be flush with a surface of the first electrical insulator layer.

14. The thermal conductive substrate according to claim 1, wherein a heat-radiating board is further joined on an outer side of the second electrical insulator layer.

15. A thermal conductive substrate comprising:
    a first electrical insulator layer;
    a second electrical insulator layer; and
    a lead frame serving as a circuit pattern;
    wherein the first electrical insulator layer is formed of a thermal conductive resin composition comprising a thermosetting resin and an inorganic filler, and is joined to the lead frame,
    the second electrical insulator layer is provided on a side of the first electrical insulator layer not in contact with the lead frame, and is formed of a thermal conductive resin composition comprising the inorganic filler and a resin composition comprising the thermosetting resin,
    the second electrical insulator layer has a higher thermal conductivity than the first electrical insulator layer, and
    wherein a heat-radiating board is further joined on an outer side of the second electrical insulator layer.

16. The thermal conductive substrate according to claim 15, wherein the second electrical insulator layer has a higher blend ratio of the inorganic filler than the first electrical insulator layer.

17. The thermal conductive substrate according to claim 15, wherein the first electrical insulator layer has a ratio of the inorganic filler of 70 to 95 wt %.

18. The thermal conductive substrate according to claim 15, wherein the second electrical insulator layer is thicker than the first electrical insulator layer.

19. The thermal conductive substrate according to claim 15, wherein the second electrical insulator layer further comprises a reinforcing material.

20. The thermal conductive substrate according to claim 15, wherein the first electrical insulator layer has a thermal conductivity of at least 1 W/m·K (Watt/Meter·Kelvin) and not higher than 5 W/m·K, and the second electrical insulator layer has a thermal conductivity of higher than 5 W/m·K and not higher than 15 W/m·K.

* * * * *